US006971899B1

(12) United States Patent
Liu

(10) Patent No.: US 6,971,899 B1
(45) Date of Patent: Dec. 6, 2005

(54) FASTENING DEVICE FOR CARD

(76) Inventor: Chin-Ching Liu, No. 25, Lane 16, Tung Hsing St., Shu-Lin City, Taipei Hsien (TW)

( * ) Notice: Subject to any disclaimer, the term of this patent is extended or adjusted under 35 U.S.C. 154(b) by 0 days.

(21) Appl. No.: 10/845,130

(22) Filed: May 14, 2004

(51) Int. Cl.[7] .............................................. H01R 13/62

(52) U.S. Cl. ...................................................... 439/326

(58) Field of Search .......................... 439/326, 73, 330, 439/74, 62

(56) References Cited

U.S. PATENT DOCUMENTS 5,268,820 A * 12/1993 Tseng et al. ................ 361/785

* cited by examiner

*Primary Examiner*—Javaid H. Nasri
(74) *Attorney, Agent, or Firm*—Troxell Law Office, PLLC

(57) ABSTRACT

A device for fastening a card on the motherboard of a computer is provided. In one embodiment, the device comprises an elongated, upright snapping assembly and a substantially U-shaped seat assembly secured thereon. Fastening a first end of the card at a connector on the motherboard, placing the second end thereof in the fastening device by pressing a latch member, positioning two risers in two slits of the second end, and releasing the latch member will cause two latch elements to exert a resilient force on the second end of the card for fastening.

3 Claims, 9 Drawing Sheets

FASTENING DEVICE FOR CARD

BACKGROUND OF THE INVENTION

1. Field of the Invention

The present invention relates to fastening devices and more particularly to an improved device for fastening a card on the motherboard of a computer.

2. Description of Related Art

Conventionally, a card is added to a computer for providing additional functions. The size of card is reduced gradually as the development of miniature electronic products. For example, a card is disposed laterally in a notebook complying with mini PCI (Peripheral Component Interconnect). That is, holes of the connector on the motherboard are disposed laterally. A card is thus disposed laterally on the motherboard after fastening at the connector. As an end, the occupied height is much reduced. Also, fastening devices are provided on the motherboard for holding the card stably in addition to the snapping coupling force of the connector exerted on the card. Unfortunately, such fastening devices suffered from several disadvantages such as complicated components, difficult installation, etc. Thus, the need for improvement still exists.

SUMMARY OF THE INVENTION

It is an object of the present invention to provide a device for fastening a card on the motherboard of a computer in an easy, simple installation procedure.

In one aspect of the present invention there is provided a device for fastening a card on a motherboard of a computer, comprising an elongated, upright snapping assembly comprising a central board, two wing plates extended from both ends of the board, two supports each extended from one end of the wing plate, two latch elements each formed on the support, two tabs each extended from a bottom of the support and being perpendicular thereto, and a latch member extended from a top of the board; and a substantially U-shaped seat assembly comprising an elongated base, two end support elements disposed perpendicular with respect to the base, two spaced resilient members each extended toward the support element and above the base for urging against the support, two upright stop plates opposite the resilient members for matingly engaging with the wing plates for supporting the seat assembly thereon, two clamping mechanisms each provided on the support element and including a raised flat member and an opposite, spaced tab member wherein the tab is adapted to insert through a gap between the flat member and the tab member to be disposed under the flat member with a lower portion of the support being clamped by the tab member, two bifurcated attachment brackets each extended downwardly from the support element to fasten on the motherboard, two walls each formed on an outer edge of the support element, and two risers each extended upright from the wall; whereby fastening a first end of the card at a connector on the motherboard, placing the second end thereof in the fastening device by pressing the latch member, positioning the risers in two slits of the second end, and releasing the latch member will cause the latch elements to exert a resilient force on the second end of the card for fastening.

In another aspect of the present invention there is provided a device for fastening a card on a motherboard of a computer, comprising an elongated, upright snapping assembly comprising a central board, two wing plates extended from both ends of the board, two supports each extended from one end of the wing plate, two latch elements each formed on the support, two tabs each extended from a bottom of the support and being perpendicular thereto, and a latch member extended from a top of the board; and a seat assembly comprising two opposite, spaced L-shaped sections each including a transverse base, a longitudinal support element, a resilient member extended toward the support element and above the base for urging against the support, an upright stop plates opposite the resilient member for matingly engaging with the wing plate for supporting the seat assembly thereon, a clamping mechanism provided on the support element and including a raised flat member and an opposite, spaced tab member wherein the tab is adapted to insert through a gap between the flat member and the tab member to be disposed under the flat member with a lower portion of the support being clamped by the tab member, a bifurcated attachment bracket extended downwardly from the support element to fasten on the motherboard, a wall formed on an outer edge of the support element, and a riser extended upright from the wall; whereby fastening a first end of the card at a connector on the motherboard, placing the second end thereof in the fastening device by pressing the latch member, positioning the risers in two slits of the second end, and releasing the latch member will cause the latch elements to exert a resilient force on the second end of the card for fastening.

The above and other objects, features and advantages of the present invention will become apparent from the following detailed description taken with the accompanying drawings.

DETAILED DESCRIPTION OF THE PREFERRED EMBODIMENTS

Figure 1A:
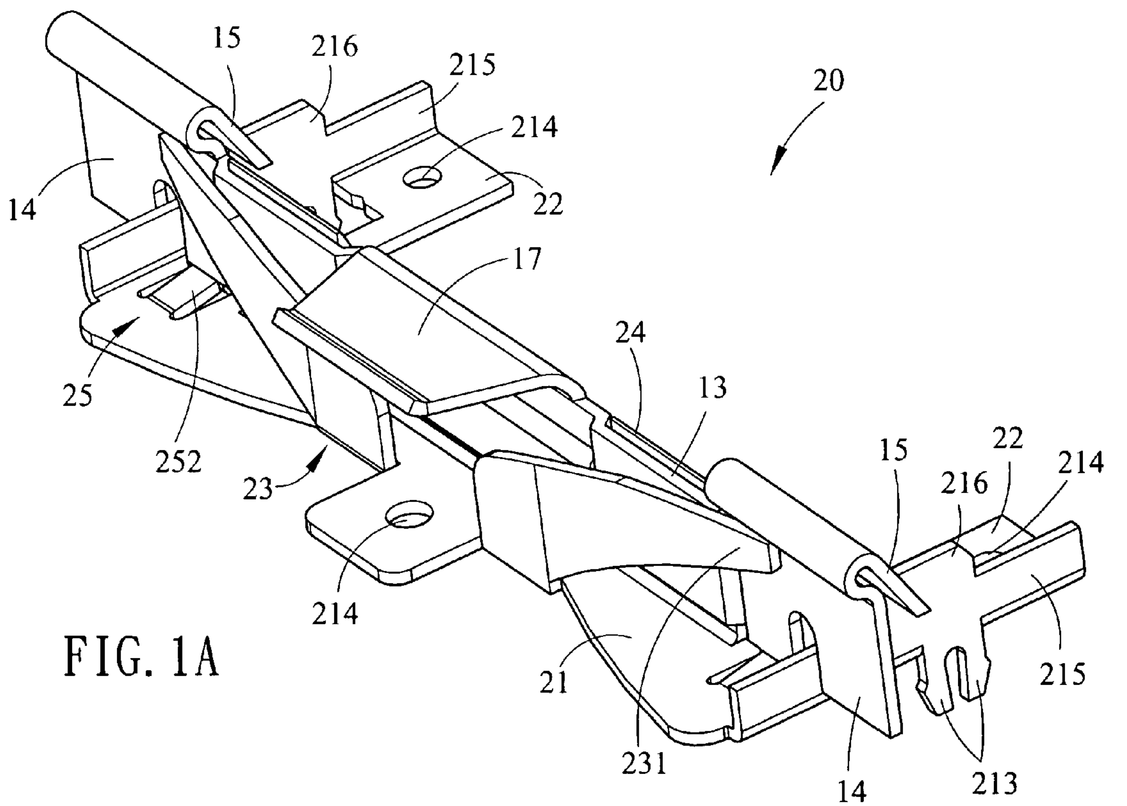
FIGS. 1A and 1B are front and rear perspective views respectively of a first preferred embodiment of fastening device for card according to the invention.
Figure 1B:
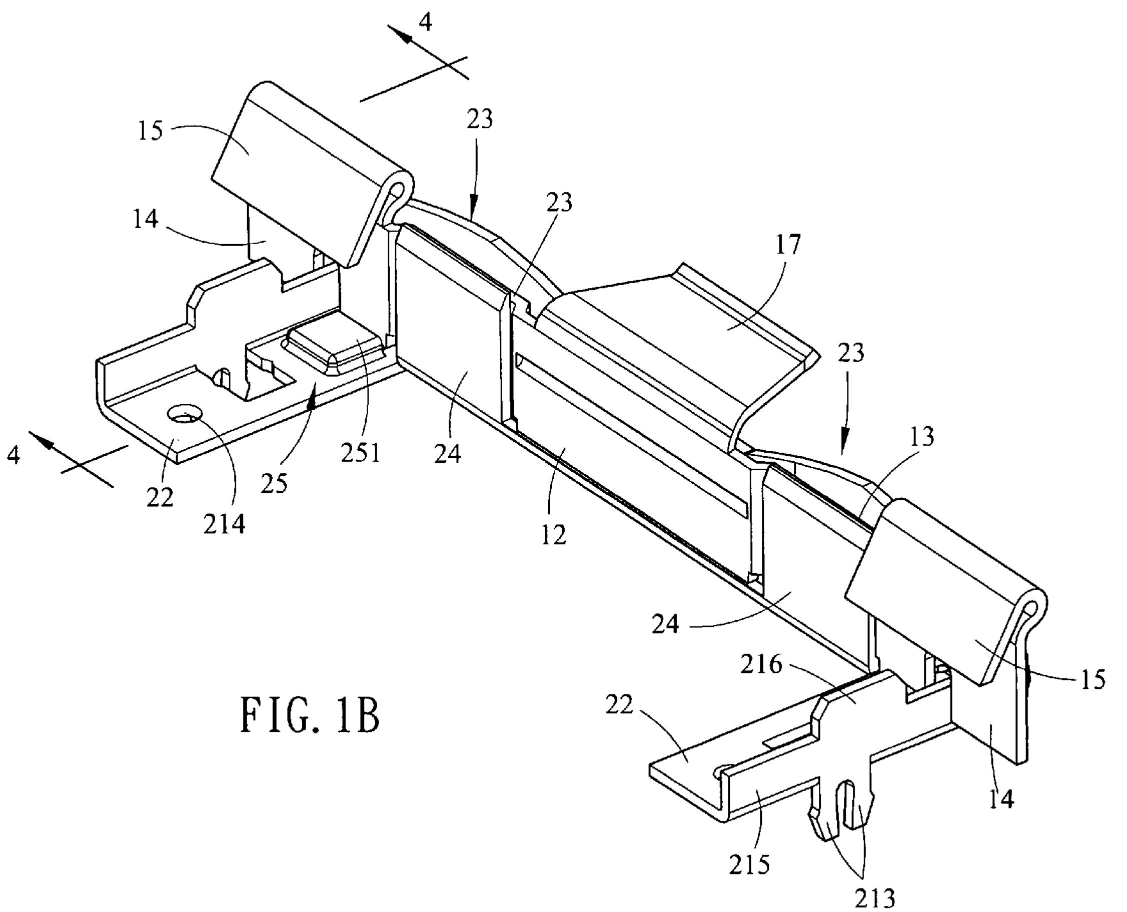
Figure 5:
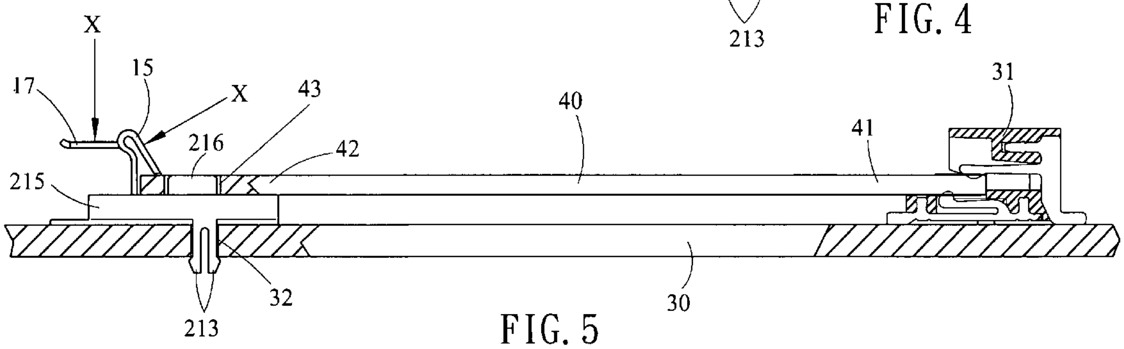
FIG. 5 is a sectional view of the carding device mounted on the motherboard of a computer, where the first end of the card is inserted into the connector and the second end thereof is fastened.

Referring to FIGS. 1A, 1B and 5, a fastening device constructed in accordance with a first preferred embodiment of the invention is shown. The fastening device is fastened on a motherboard 30 of a computer and is spaced from a connector 31. A card 40 has a first end 41 fastened at the connector 31. The fastening device comprises a snapping assembly 11 and a seat assembly 20 as described in detail below.

Figure 2A:
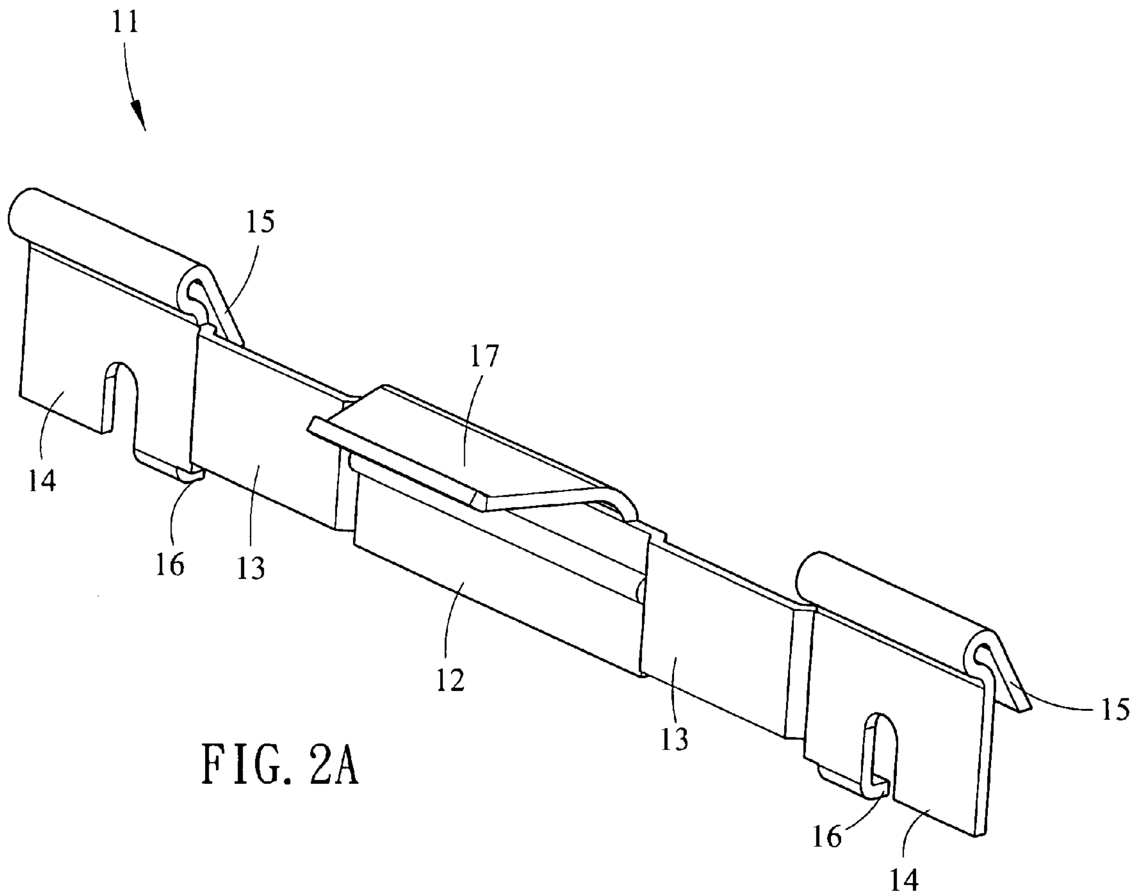
FIGS. 2A and 2B are front and rear perspective views of the snapping assembly respectively.
Figure 2B:
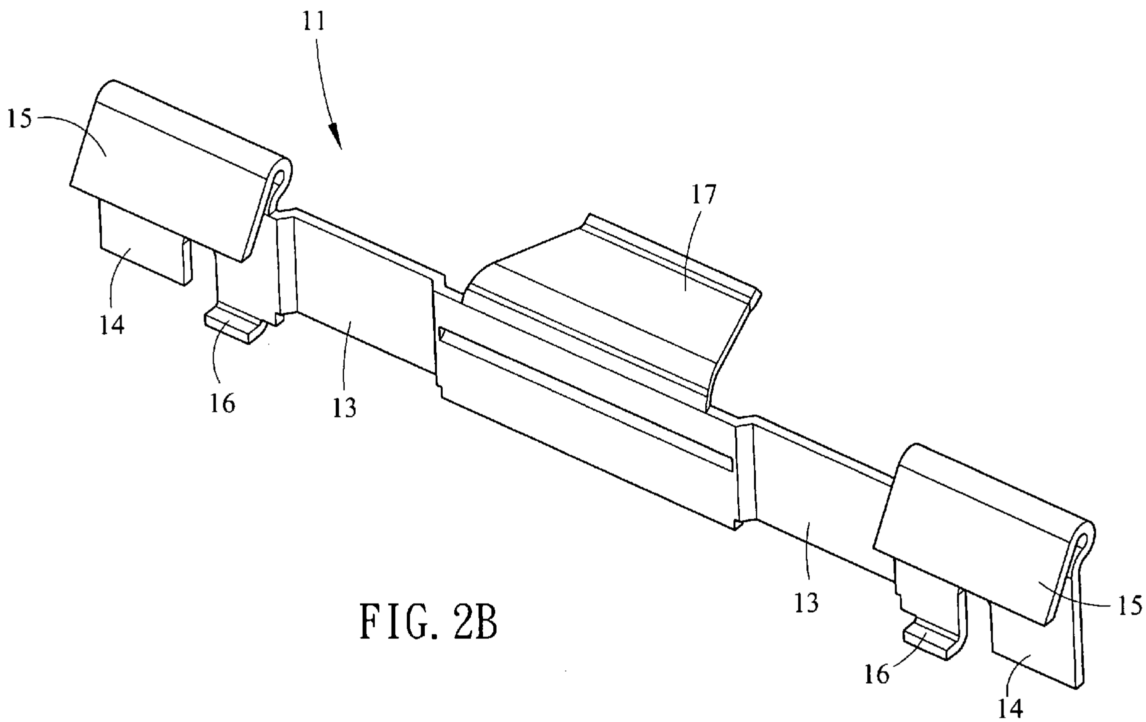

Referring to FIGS. 2A and 2B, the elongated, upright snapping assembly 11 comprises a thin plate 12, two wing plates 13 extended from both ends of the plate 12, two supports 14 each extended from one end of the wing plate 13, two latch elements 15 each formed on a top of the support 14, two tabs 16 each extended from a bottom of the support 14 and being perpendicular thereto, and a latch member 17 arcuately extended from a top of the plate 12. The extending direction of the latch element 15 is opposite to that of the latch member 17. A force exerted upon the latch elements 15 or the latch member 17 can resiliently deform the snapping assembly 11.

Figure 3A:
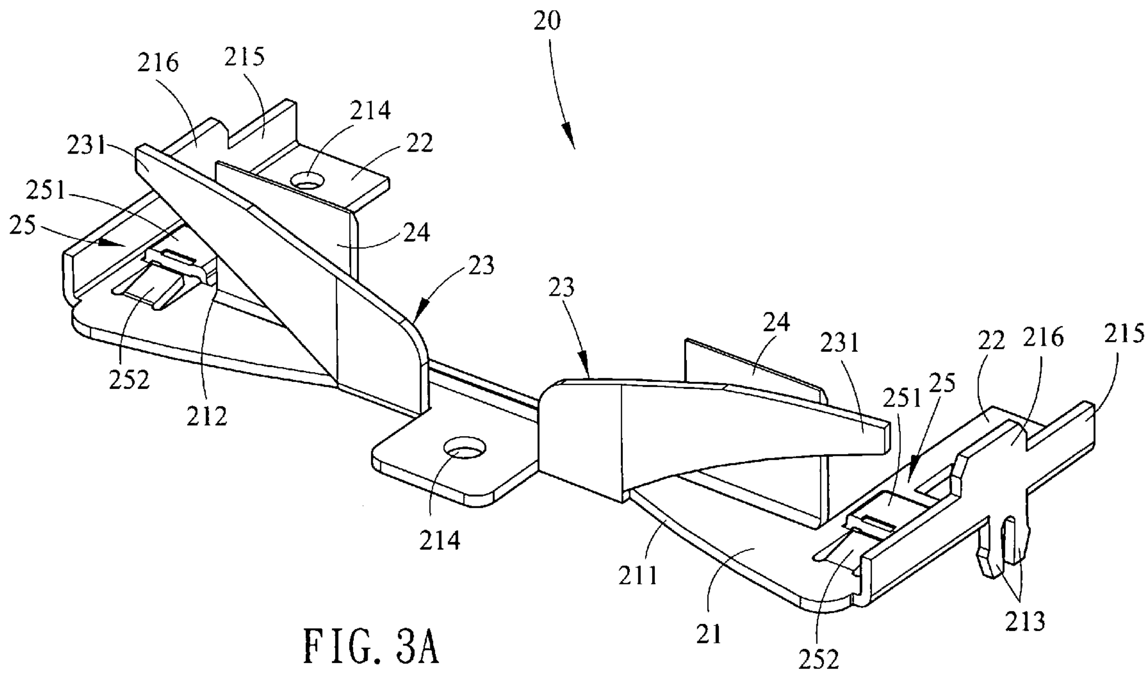
FIGS. 3A and 3B are front and rear perspective views of the seat assembly respectively.
Figure 3B:
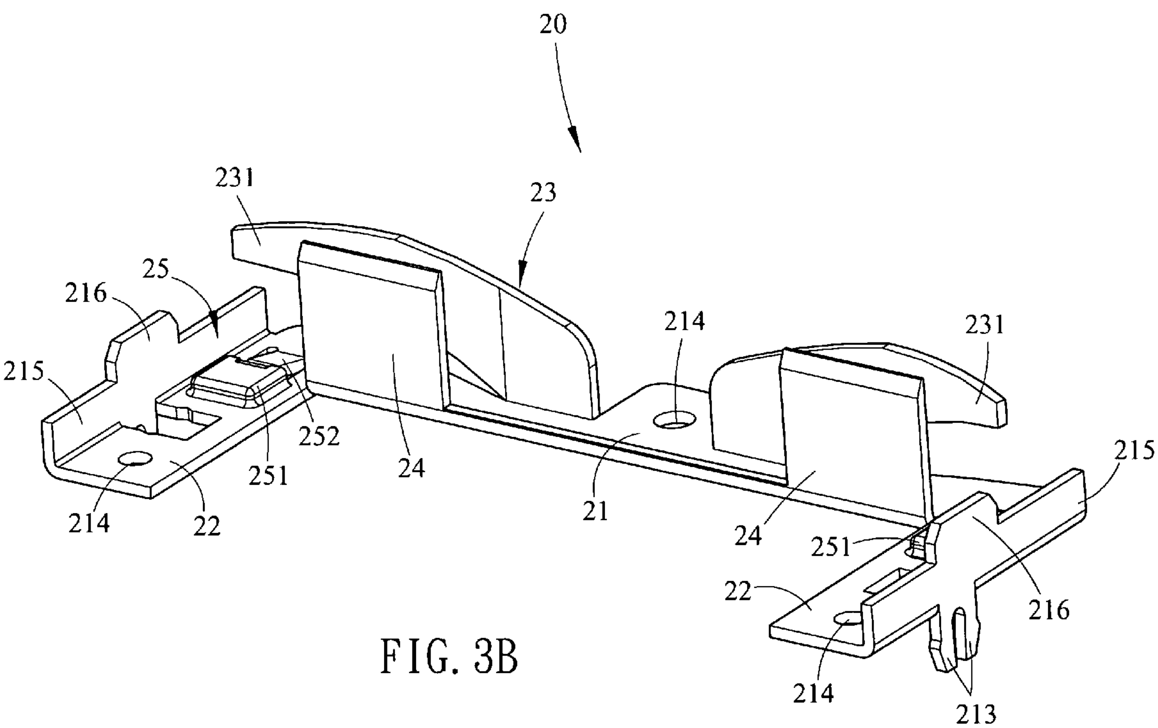

Referring to FIGS. 3A and 3B, the substantially U-shaped seat assembly 20 comprises an elongated base 21, two end support elements 22 disposed perpendicular with respect to the base 21, and two resilient members 23 spaced apart by a central projection having a hole 214, the resilient member 23 being extended toward the support element 22 to form a resilient end 231 and being above a front edge 211 of the base 21 by a predetermined distance so that the support 14 can be coupled to the resilient end 231. The seat assembly 20 further comprises two stop plates 24 extended upward from a rear edge of the base 21. The stop plates 24 are adapted to matingly engage with the wing plates 13 for supporting the seat assembly 20. As an end, the card 40 is adapted to be fastened by the latch elements 15 (see FIG. 5).

Figure 4:
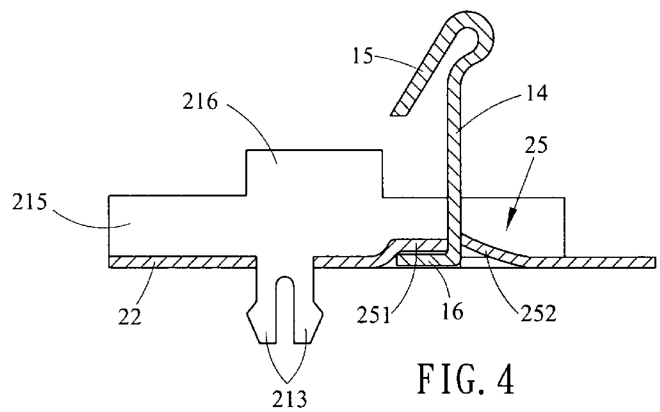
FIG. 4 is a sectional view taken along line 4—4 of FIG. 1B.

A clamping mechanism 25 is provided on each support element 22. The clamping mechanism 25 comprises a raised flat member 251 and an opposite tab member 252. The flat member 251 is adapted to dispose on the tab 16. The tab member 252 is slanted upwardly and is flexible. The flat member 251 and the tab member 252 are spaced by a gap so that the tab 16 can be inserted to be disposed under the flat member 251. As shown in FIG. 4, the ears 16 are disposed under the flat members 251 and the lower portions of the supports 14 are clamped by the tab members 252. As an end, the ears 16 are fastened.

Under the support element 22 there is provided a bifurcated attachment bracket 213 extended downwardly. One of a plurality of holes 32 on the motherboard 30 is adapted to receive and fasten the attachment bracket 213 therein so as to secure the fastening device onto the motherboard 30. On the support element 22 there are provided a hole 214 so that a fastener (e.g., screw or bolt) can be driven thereinto for securing the support element 22 on the motherboard 30, and a wall 215 bent about 90 degrees about the support element 22, the wall 215 having a top riser 216 adapted to snugly insert into an elongate slit 43 at the second end 42 of the card 40 when the second end 42 is fastened by the latch element 15. As an end, the card 40 is secured onto the wall 215.

Referring to FIGS. 1A and 1B again, the bottom of the snapping assembly 11 is resiliently fastened by both the flat members 251 and the tab members 252. Moreover, the resilient ends 231 are urged against the snapping assembly 11 so as to further fasten the snapping assembly 11 on the seat assembly 20.

Referring to FIG. 5, an operation of fastening the card 40 on the motherboard 30 by means of the fastening device of the invention will now be described in detail below. First, insert the first end 41 of the card 40 into the connector 31 and then place the second end 42 thereof in the fastening device by pressing the latch member 17 as indicated by a left arrow X in which the latch elements 15 pivot counterclockwise for storing resilient force. After positioning the risers 216 in the slits 43 of the second end 42, release the latch member 17 to cause the latch elements 15 to pivot clockwise to exert a strong resilient force on the second end 42 as indicated by a right, oblique arrow X. As an end, the second end 42 of the card 40 is fastened by the fastening device.

To the contrary, a user may press the latch member 17 as indicated by the left arrow X or counterclockwise pivot the latch elements 15 prior to pulling the second end 42 out of the fastening device. Next, remove the first end 41 from the connector 31. This finishes the disassembly of the card 40 from the motherboard 30.

Figure 6:
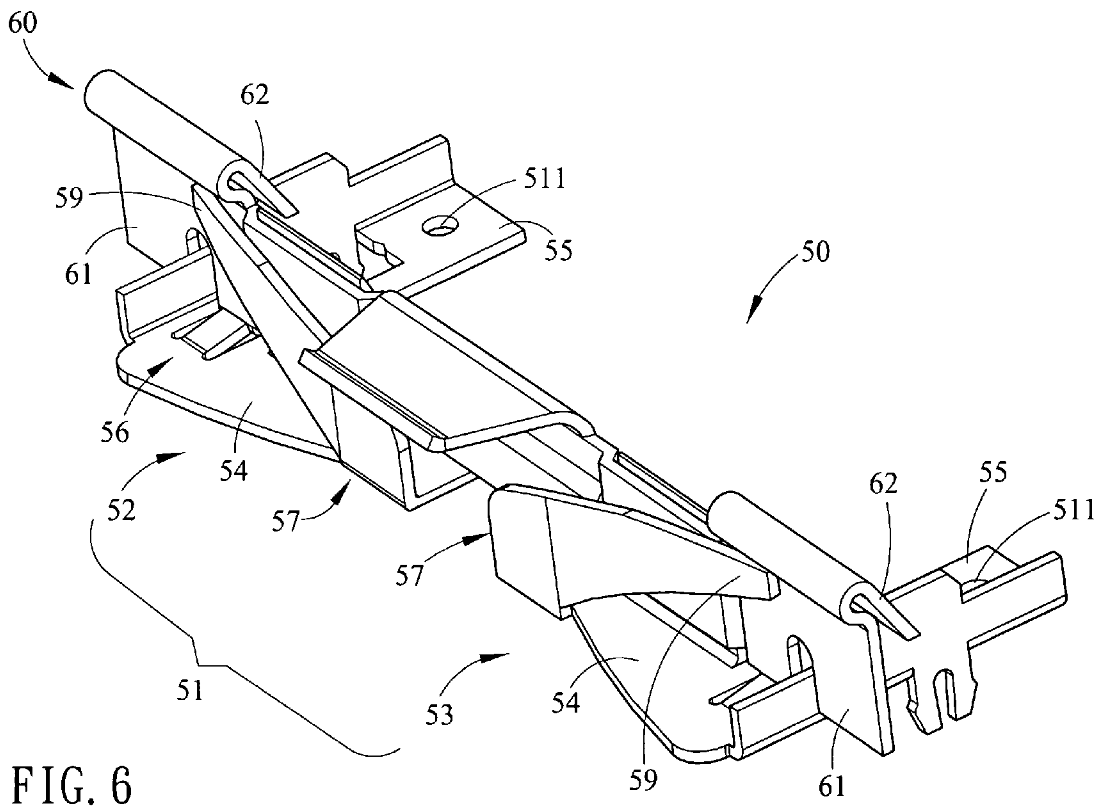
FIG. 6 is a perspective view of a second preferred embodiment of fastening device for card according to the invention.
Figure 7:
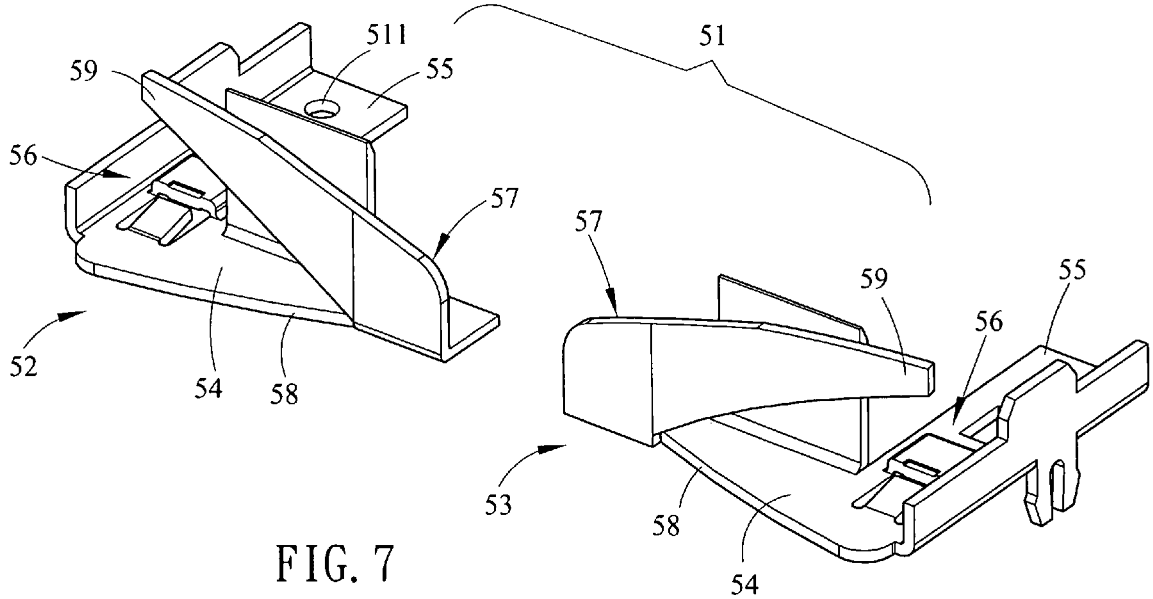
FIG. 7 is a perspective view of the seat assembly of FIG. 6.

Referring to FIGS. 6 and 7, a second preferred embodiment of fastening device for card according to the invention is shown. The second preferred embodiment substantially has same structure as the first preferred embodiment. The differences between the first and the second preferred embodiments, i.e., the characteristics of the second preferred embodiment are detailed below. The seat assembly 51 comprises two separate first and second seats 52 and 53 each having a base 54. A support element 55 is integrally formed with the base 54 and is disposed perpendicular thereto. A clamping mechanism 56 is provided on each support element 55. The clamping mechanisms 56 act in cooperation with wing portions of the snapping assembly 60 to form a resilient clamping device. A resilient member 57 is extended toward the support element 55 to form a resilient end 59 and is above a front edge 58 of the base 54 by a predetermined distance so that the supports 61 of the snapping assembly 60 can be coupled to the resilient ends 59. On the support element 55 there is provided a hole 511 so that a fastener (e.g., screw or bolt) can be driven thereinto for securing the support element 55 on the motherboard 30. Similarly, disposing the second end 42 of the card 40 in the fastening device 50 in which the second end 42 is urged by the latch elements 62 of the snapping assembly 60 will cause the card 40 to be fastened by the fastening device 50.

While the invention herein disclosed has been described by means of specific embodiments, numerous modifications and variations could be made thereto by those skilled in the art without departing from the scope and spirit of the invention set forth in the claims.

What is claimed is:

1. A device for fastening a card on a motherboard of a computer, comprising:

an elongated, upright snapping assembly comprising a central board, two wing plates extended from both ends of the board, two supports each extended from one end of the wing plate, two latch elements each formed on the support, two tabs each extended from a bottom of the support and being perpendicular thereto, and a latch member extended from a top of the board; and a substantially U-shaped seat assembly comprising an elongated base, two end support elements disposed perpendicular with respect to the base, two spaced resilient members each extended toward the support element and above the base for urging against the support, two upright stop plates opposite the resilient members for matingly engaging with the wing plates for supporting the seat assembly thereon, two clamping mechanisms each provided on the support element and including a raised flat member and an opposite, spaced tab member wherein the tab is adapted to insert through a gap between the flat member and the tab member to be disposed under the flat member with a lower portion of the support being clamped by the tab member, two bifurcated attachment brackets each extended downwardly from the support element to fasten on the motherboard, two walls each formed on an outer edge of the support element, and two risers each extended upright from the wall;

whereby fastening a first end of the card at a connector on the motherboard, placing the second end thereof in the fastening device by pressing the latch member, positioning the risers in two slits of the second end, and releasing the latch member will cause the latch elements to exert a resilient force on the second end of the card for fastening.

2. The device of claim 1, wherein the snapping assembly further comprises a central projection for spacing the resilient members apart.

3. A device for fastening a card on a motherboard of a computer, comprising:

an elongated, upright snapping assembly comprising a central board, two wing plates extended from both ends of the board, two supports each extended from one end of the wing plate, two latch elements each formed on the support, two tabs each extended from a bottom of the support and being perpendicular thereto, and a latch member extended from a top of the board; and a seat assembly comprising two opposite, spaced L-shaped sections each including a transverse base, a longitudinal support element, a resilient member extended toward the support element and above the base for urging against the support, an upright stop plates opposite the resilient member for matingly engaging with the wing plate for supporting the seat assembly thereon, a clamping mechanism provided on the support element and including a raised flat member and an opposite, spaced tab member wherein the tab is adapted to insert through a gap between the flat member and the tab member to be disposed under the flat member with a lower portion of the support being clamped by the tab member, a bifurcated attachment bracket extended downwardly from the support element to fasten on the motherboard, a wall formed on an outer edge of the support element, and a riser extended upright from the wall;

whereby fastening a first end of the card at a connector on the motherboard, placing the second end thereof in the fastening device by pressing the latch member, positioning the risers in two slits of the second end, and releasing the latch member will cause the latch elements to exert a resilient force on the second end of the card for fastening.

* * * * *